(12) United States Patent
Wang et al.

(10) Patent No.: US 12,123,917 B2
(45) Date of Patent: Oct. 22, 2024

(54) METHOD AND SYSTEM FOR DETERMINING REMAINING CHARGING TIME OF BATTERY

(71) Applicant: CONTEMPORARY AMPEREX TECHNOLOGY CO., LIMITED, Ningde (CN)

(72) Inventors: Haijiang Wang, Ningde (CN); Shuting Sun, Ningde (CN); Xu Liang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 133 days.

(21) Appl. No.: 18/058,008

(22) Filed: Nov. 22, 2022

(65) Prior Publication Data

US 2023/0204672 A1 Jun. 29, 2023

Related U.S. Application Data

(63) Continuation of application No. PCT/CN2022/089069, filed on Apr. 25, 2022.

(30) Foreign Application Priority Data

Dec. 29, 2021 (CN) .......................... 202111631835.3

(51) Int. Cl.
*G01R 31/3842* (2019.01)
*H02J 7/00* (2006.01)

(52) U.S. Cl.
CPC ........ *G01R 31/3842* (2019.01); *H02J 7/0047* (2013.01)

(58) Field of Classification Search
None
See application file for complete search history.

(56) References Cited

U.S. PATENT DOCUMENTS

| 2012/0101754 A1 | 4/2012 | Halme |
| 2014/0167774 A1 | 6/2014 | Yagura et al. |
| (Continued) | | |

FOREIGN PATENT DOCUMENTS

| CN | 101436690 A | 5/2009 |
| CN | 106786862 A | 5/2017 |
| (Continued) | | |

OTHER PUBLICATIONS

The European Patent Office (EPO) The Extended European Search Report for U.S. Appl. No. 22/744,636.6 Dec. 22, 2023 10 Pages.

(Continued)

*Primary Examiner* — Jas A Sanghera
(74) *Attorney, Agent, or Firm* — ANOVA LAW GROUP, PLLC

(57) ABSTRACT

A method for determining a remaining charging time of a battery. The method includes obtaining a first charging current and a second charging current. The first charging current is a present charging current of the battery, and the second charging current is a charging current of the battery when the battery is fully charged. The method further includes determining an average charging current value based on the first charging current and the second charging current, and determining the remaining charging time based on the average charging current value.

4 Claims, 4 Drawing Sheets

(56) References Cited

U.S. PATENT DOCUMENTS

| | | | | |
|---|---|---|---|---|
| 2015/0180255 A1* | 6/2015 | Kim | ........................ | B60L 53/65 320/162 |
| 2023/0280408 A1* | 9/2023 | Nam | ........................ | B60L 58/12 320/162 |

FOREIGN PATENT DOCUMENTS

| | | | |
|---|---|---|---|
| CN | 108303650 | A | 7/2018 |
| CN | 108646190 | A | 10/2018 |
| CN | 108896928 | A | 11/2018 |
| CN | 111422092 | A | 7/2020 |
| CN | 112035777 | A | 12/2020 |
| CN | 112098864 | A | 12/2020 |
| CN | 112798966 | A | 5/2021 |
| EP | 3915827 | A1 | 12/2021 |
| JP | S5522240 | A | 2/1980 |
| JP | H09322420 | A | 12/1997 |
| JP | 2002315204 | A | 10/2002 |
| JP | 2009077466 | A | 4/2009 |
| JP | 2012239290 | A | 12/2012 |
| JP | 2014121140 | A | 6/2014 |
| KR | 100834958 | B1 | 5/2008 |
| TW | 201534021 | A | 9/2015 |

OTHER PUBLICATIONS

The Japan Patent Office (JPO) Notification of Reasons for Refusal for Application No. 2022-547892 Feb. 13, 2024 14 Pages (including translation).

The China National Intellectual Property Administration (CNIPA) Notice of the first review opinion for CN Application No. 202111631835.3 Jun. 2, 2023 7 Pages (including English translation).

The World Intellectual Property Organization (WIPO) International Search Report and written opinion for PCT/CN2022/089069 Sep. 7, 2022 12 pages (including English translation).

Jingyi Du et al., Prediction of Remaining Time of Lithium Batterycharging Based On Indylstm, May 2021, pp. 112-116, vol. 38, No. 5, Computer Applications and Software.

Budi Amri, et al., Design of Batteries Charging by Charge Management Concepts on Photovoltaic Standalone System, 2016, pp. 93-98, International Seminar on Application for Technology of Information and Communication.

The China National Intellectual Property Administration (CNIPA) The Grant for Chinese Application 202111631835.3 Aug. 29, 2023 3 Pages (With Translation).

Korean Intellectual Property Office (KIPO) Office Action 1 for Application No. 10-2022-7027813 Apr. 22, 2024 7 Pages (including translation).

* cited by examiner

METHOD AND SYSTEM FOR DETERMINING REMAINING CHARGING TIME OF BATTERY

CROSS-REFERENCE TO RELATED APPLICATIONS

The present application is a continuation of International Application No. PCT/CN2022/089069, filed on Apr. 25, 2022, which claims priority to Chinese Patent Application No. 202111631835.3, filed on Dec. 29, 2021, and entitled "METHOD AND SYSTEM FOR DETERMINING REMAINING CHARGING TIME OF BATTERY", the entire contents of both of which are incorporated herein by reference.

TECHNICAL FIELD

The present application relates to the field of battery technologies, and in particular, to a method and system for determining a remaining charging time of a battery.

BACKGROUND ART

With the rapid development of the new energy industry, new energy vehicles are gaining in popularity. In the use of a vehicle, a charging speed and a charging time are the biggest concerns for a vehicle owner. In particular, the charging time affects not only when the vehicle is available for the vehicle owner, but also how the vehicle owner plans to use the vehicle. Mostly, the vehicle owner is informed in advance of the charging time in the form of a remaining charging time calculated during charging, which provides a basis for when the vehicle is available for the vehicle owner and how the vehicle owner plans to use the vehicle. However, at present, there is a large error in algorithms for calculating a remaining charging time of a battery, which causes inconvenience and a poor experience in the use of the vehicle by the vehicle owner.

SUMMARY

The present application provides a method and system for determining a remaining charging time of a battery, so that a current remaining charging time of a battery can be determined with higher accuracy.

According to a first aspect, the present application provides a method for determining a remaining charging time of a battery, including: obtaining a first charging current, where the first charging current is a present charging current of the battery; determining a second charging current, where the second charging current is a charging current of the battery when the battery is fully charged; determining an average value of the charging currents based on the first charging current and the second charging current; and determining the remaining charging time based on the average value of the charging currents.

This embodiment of the present application can implement the method for determining a remaining charging time of a battery. The average value of the charging currents is determined based on the present charging current of the battery and the charging current of the battery when the battery is fully charged, and then the remaining charging time is determined based on the average value of the charging currents. In this way, errors during calculation due to the use of a value of a current output in real time can be greatly reduced, and a relatively accurate remaining charging time of the battery can be obtained in an initial phase of charging, making a calculation result of the remaining charging time of the battery closer to an actual charging time. The calculation result is provided to a vehicle owner, a charging station, etc., so that the vehicle owner plans to use a vehicle properly, and the charging station can make a more scientific and reliable charging plan.

In a possible embodiment, the determining a second charging current includes: determining the second charging current during the present charging based on a first full-charge voltage and a charging power of a charging apparatus during the present charging, where the first full-charge voltage is a calculated value of an end-of-charge voltage of the battery.

In the foregoing embodiment, a charging current when the battery is fully charged this time is obtained based on the calculated end-of-charge voltage of the battery and the constant charging power of the charging apparatus. With this method, the charging current when the battery is fully charged this time is estimated with higher calculation accuracy, so that the remaining charging time of the battery is subsequently determined with accuracy.

In a possible embodiment, the determining a second charging current includes: determining the second charging current during the present charging based on a second full-charge voltage and a charging power of a charging apparatus during the present charging, where the second full-charge voltage is an actual value of an end-of-charge voltage of the battery during the previous charging.

In the foregoing embodiment, the actual value of the end-of-charge voltage of the battery during the previous charging is recorded; and during the present charging, the charging current when the battery is fully charged this time is obtained based on an end-of-charge voltage of the battery during the previous charging and the constant charging power of the charging apparatus. The end-of-charge voltage of the battery is related to a state of health (SOH) of the battery, and changes with times of charging. Therefore, the charging current when the battery is fully charged this time can be calculated with higher accuracy based on the actual end-of-charge voltage of the battery during the previous charging, making the calculation result of the remaining charging time of the battery more reliable.

According to a second aspect, the present application further provides a system for determining a remaining charging time of a battery, including a processing module configured to: obtain a first charging current, where the first charging current is a present charging current of the battery; determine a second charging current, where the second charging current is a charging current of the battery when the battery is fully charged; determine an average value of the charging currents based on the first charging current and the second charging current; and determine the remaining charging time based on the average value of the charging currents.

In a possible embodiment, the processing module is further configured to: determine the second charging current during the present charging based on a first full-charge voltage and a charging power of a charging apparatus during the present charging, where the first full-charge voltage is a calculated value of an end-of-charge voltage of the battery.

In a possible embodiment, the processing module is further configured to: determine the second charging current during the present charging based on a second full-charge voltage and a charging power of a charging apparatus during the present charging, where the second full-charge voltage is an actual value of an end-of-charge voltage of the battery during the previous charging.

In a possible embodiment, the system further includes a storage module configured to store the second full-charge voltage.

According to a third aspect, the present application further provides a battery management system, including a processor and a memory, where the memory is configured to store a computer program, and the processor is configured to invoke the computer program to perform the method according to any one of the possible embodiments of the first aspect.

According to a fourth aspect, the present application further provides a readable storage medium configured to store a computer program, where the computer program is used to perform the method according to any one of the possible embodiments of the first aspect.

BRIEF DESCRIPTION OF THE DRAWINGS

In order to more clearly illustrate the technical solutions of the embodiments of the present application, the drawings to be used in the description of the embodiments of the present application will be described briefly below. Obviously, the drawings in the following description are merely some embodiments of the present application. For those skilled in the art, other drawings can also be obtained according to these drawings without the inventive labor.

DETAILED DESCRIPTION OF EMBODIMENTS

Figure 1:
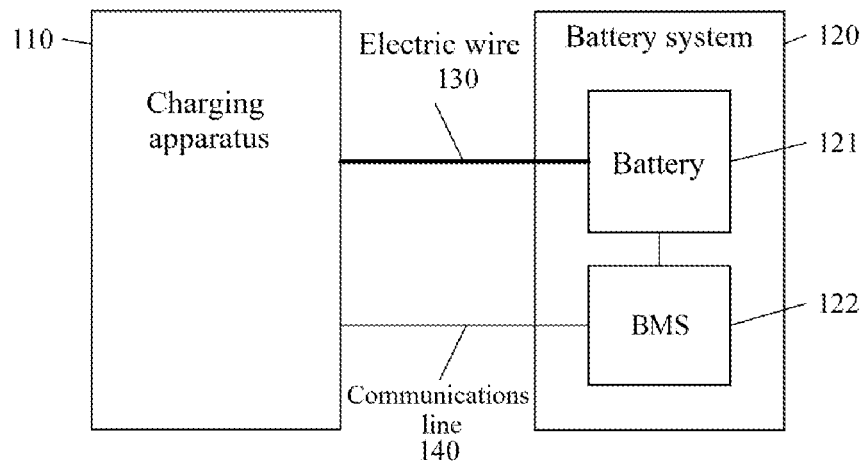
FIG. 1 is a schematic structural diagram of a charging system disclosed in an embodiment of the present application.

The following further describes in detail implementations of the present application with reference to the accompanying drawings and embodiments. The detailed description of the following embodiments and the drawings are used to illustrate the principle of the present application by way of example, but shall not be used to limit the scope of the present application. In other words, the present application is not limited to the described embodiments.

In the description of the present application, it should be noted that, unless otherwise specified, "a plurality of" means at least two. An orientation or a position relationship indicated by the terms "upper", "lower", "left", "right", "inner", "outer", etc. is merely for convenient and brief description of the present application, rather than indicating or implying that an indicated apparatus or element needs to have a particular orientation or be constructed and operated in a particular orientation, and therefore cannot be construed as limiting the present application. In addition, the terms "first", "second", "third", etc. are merely for the purpose of description, and shall not be construed as indicating or implying relative importance. "Perpendicular" is not necessarily perpendicular in the strict sense, and a range of errors is allowed. "Parallel" is not necessarily parallel in the strict sense, and a range of errors is allowed.

The orientation terms in the following description all indicate directions shown in the drawings, and do not impose a limitation on a specific structure in the present application. In the description of the present application, it should further be noted that, the term "mount", "engage", and "connect" should be interpreted in the broad sense unless explicitly defined and limited otherwise, which, for example, may mean a fixed connection, a detachable connection or an integral connection; or may mean a direct connection, or an indirect connection by means of an intermediary. For those of ordinary skill in the art, specific meanings of the foregoing terms in the present application may be understood in specific circumstances.

With the rapid development of the new energy industry, new energy vehicles are gaining in popularity. In the use of a vehicle, a charging speed and a charging time become the biggest concerns for a vehicle owner. The charging time affects not only when the vehicle is available for the vehicle owner, but also how the vehicle owner plans to use the vehicle. Mostly, the vehicle owner is informed in advance of the charging time in the form of a remaining charging time calculated through a software algorithm during charging, which provides a basis for when the vehicle is available for the vehicle owner and how the vehicle owner plans to use the vehicle.

At present, for commercially available slow charging, a main method for calculating a remaining charging time is: Remaining charging time=Remaining capacity/Charging current output by a charging pile in real time. However, during slow charging of an electric vehicle, an output power of a charging pile is a constant output power, and a voltage of a battery of the electric vehicle gradually increases during charging. Therefore, a charging current output by the charging pile in real time changes accordingly. Within an interval of low state of charge (SOC) of the battery, a total voltage of the battery is relatively low, and an actual current output by the charging pile is relatively large; and within an interval of high state of charge (SOC), a total voltage of the battery is relatively high, and an actual current output by the charging pile is relatively small. Therefore, according to the foregoing method, during charging of the electric vehicle, especially in an initial phase of the charging, an estimated value of the remaining charging time is less than an actual charging time when the remaining charging time is calculated based on the charging current output by the charging pile in real time, which may cause the remaining charging time to be unchanged in a relatively long time or the remaining charging time to be increasingly large. There is a relatively large error in the estimated remaining charging time, and a vehicle owner can use the vehicle only after a longer charging time, which affects when the vehicle is available for the vehicle owner and how the vehicle owner plans to use the vehicle, causing inconvenience and a poor experience in the use of the vehicle by the vehicle owner.

To solve the above problem, the present application provides a method and system for determining a remaining charging time of a battery to determine a current remaining charging time of the battery during charging with higher accuracy.

FIG. 1 is an architectural diagram of a charging system to which an embodiment of the present application is applicable.

As shown in FIG. 1, the charging system 100 may include: a charging apparatus 110 and a battery system 120. Optionally, the battery system 120 may be a battery system in an electric vehicle (including a battery electric vehicle and a plug-in hybrid electric vehicle) or a battery system in another application scenario.

Optionally, the battery system 120 may be provided with at least one battery pack, and the at least one battery pack as a whole may be referred to as a battery 121. In terms of battery type, the battery 121 may be any type of battery, which includes, but is not limited to, a lithium-ion battery, a lithium metal battery, a lithium-sulfur battery, etc. In terms of battery size, the battery 121 in this embodiment of the present application may be a cell/battery cell, or may be a battery module or battery pack, where the battery module and battery pack each may be formed by a plurality of batteries connected in series or parallel. In this embodiment of the present application, neither of a type and a size of the battery 121 is specifically limited.

Further, for smart management and maintenance of the battery 121 and preventing overcharge and over-discharge of the battery to extend a service life of the battery, the battery system 120 is usually further provided with a battery management system (BMS) 122 for monitoring a status of the battery 121. Optionally, the BMS 122 may be integrated with the battery 121 in a same device/apparatus, or the BMS 122 may be separate from the battery 121 as an independent device/apparatus.

Specifically, the charging apparatus 110 is an apparatus that replenishes the battery 121 in the battery system 120 with power and/or controls discharge of the battery 121.

Optionally, the charging apparatus 110 in this embodiment of the present application may be a regular charging pile, a super charging pile, a vehicle-to-grid (V2G) charging pile, a charging apparatus that can charge a battery, or the like. A specific type or a specific application scenario of the charging apparatus 110 is not limited in this embodiment of the present application.

Optionally, as shown in FIG. 1, the charging apparatus 110 may be connected to the battery 121 by means of an electric wire 130, and connected to the BMS 122 by means of a communications line 140, where the communications line 140 is configured to implement information exchange between the charging apparatus 110 and the BMS.

As an example, the communications line 140 includes, but is not limited to, a controller area network (CAN) communications bus or a daisy chain communications bus.

Optionally, the charging apparatus 110 may communicate with the BMS 122 by means of the communications line 140, and may also communicate with the BMS 122 over a wireless network. A type of wired communication or wireless communication between a charging apparatus and the BMS 122 is not specifically limited in this embodiment of the present application.

Figure 2:
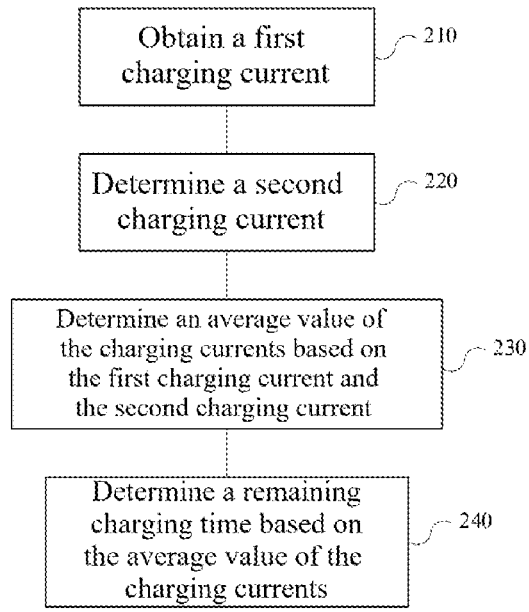
FIG. 2 is a schematic flowchart of a method for determining a remaining charging time of a battery disclosed in an embodiment of the present application.

FIG. 2 shows a method 200 for determining a remaining charging time of a battery according to an embodiment of the present application, to determine a remaining charging time of a battery 121 during charging. The method 200 may specifically include some or all of the following steps.

Step 210: Obtain a first charging current.

The first charging current is a present charging current of the battery. In terms of obtaining the charging current of the battery at the current moment, specifically, the present charging current of the battery may be obtained by obtaining a present output current of a charging pile, or the present charging current of the battery may be obtained by sampling. A specific method for obtaining the charging current is not specifically limited in the present application.

Step 220: Determine a second charging current.

The second charging current is a charging current of the battery when the battery is fully charged. Optionally, the second charging current during the present charging may be determined based on a first full-charge voltage, namely a calculated value of an end-of-charge voltage of the battery, and a charging power of a charging apparatus during the present charging. Alternatively, the second charging current during the present charging may be determined based on a second full-charge voltage, namely an actual value of an end-of-charge voltage of the battery during the previous charging, and a charging power of a charging apparatus during the present charging.

Step 230: Determine an average value of the charging currents based on the first charging current and the second charging current.

Specifically, the average value of the charging currents can be obtained by adding up and averaging the first charging current and the second charging current.

Step 240: Determine the remaining charging time based on the average value of the charging currents.

Specifically, according to a formula for calculating the remaining charging time: Remaining charging time of the battery=Remaining capacity of the battery/Average value of the charging currents, the corresponding current remaining charging time of the battery can be obtained.

In the foregoing embodiment, the average value of the charging currents can be determined based on the present charging current of the battery and the charging current of the battery when the battery is fully charged, and then the remaining charging time is determined based on the average value of the charging currents. In this way, errors during calculation due to the use of a value of a current output in real time can be greatly reduced, and an accurate remaining charging time of the battery can be obtained in an initial phase of charging, making a calculation result of the remaining charging time of the battery closer to an actual charging time. The calculation result is provided to a vehicle owner, a charging station, etc., so that the vehicle owner plans to use a vehicle properly, and the charging station can make a more scientific and reliable charging plan.

Figure 3:
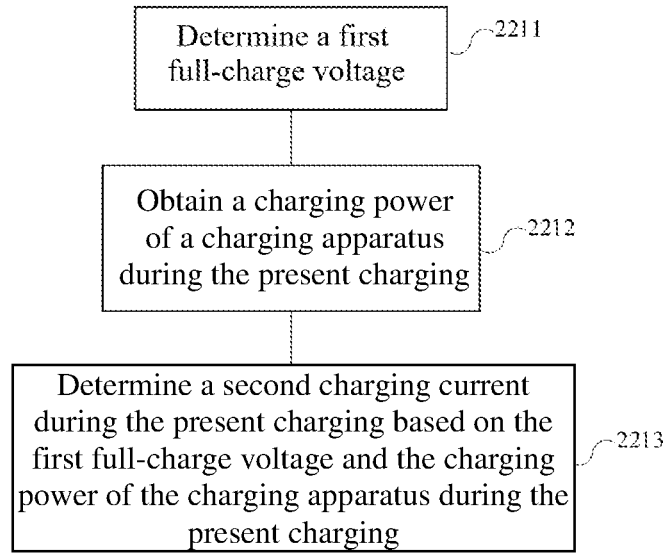
FIG. 3 is a schematic flowchart of a method for determining a second charging current disclosed in an embodiment of the present application.
Figure 4:
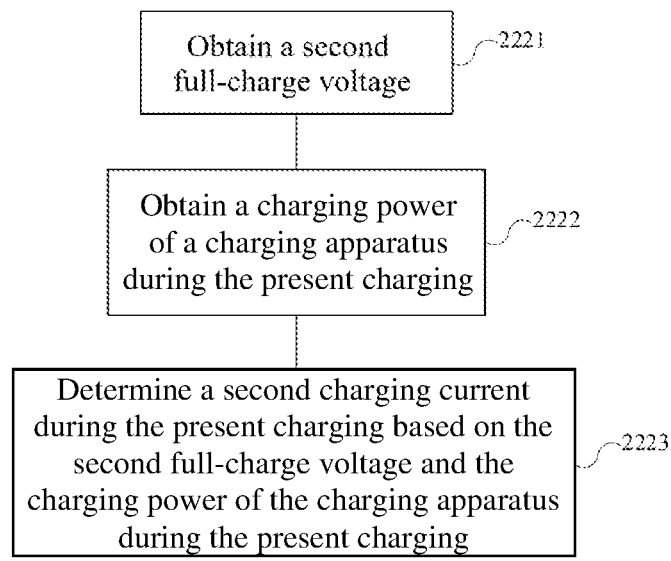
FIG. 4 is a schematic flowchart of another method for determining a second charging current disclosed in an embodiment of the present application.

Optionally, as shown in FIG. 3 and FIG. 4, step 220 of determining the second charging current may be implemented by using a method 221 and a method 222. The method 221 specifically includes the following steps.

Step 2211: Determine the first full-charge voltage.

The first full-charge voltage is a calculated value of an end-of-charge voltage of the battery. Specifically, according to a formula for calculating the end-of-charge voltage of the battery: End-of-charge voltage of the battery=End-of-full-charge voltage of a battery cell×Number of cells connected in series, the first full-charge voltage can be determined.

Step 2212: Obtain the charging power of the charging apparatus during the present charging.

Step 2213: Determine the second charging current during the present charging based on the first full-charge voltage and the charging power of the charging apparatus during the present charging.

The second charging current is a charging current of the battery when the battery is fully charged. Specifically, according to a formula: Charging current of the battery when the battery is fully charged=Charging power of the charging apparatus/First full-charge voltage, the second charging current during the present charging can be determined.

Because the charging apparatus charges the battery at a constant power, a charging power output during the charging is constant. According to the method 221, the end-of-charge voltage of the battery is calculated, and the charging current of the battery when the battery is fully charged, that is, the second charging current, can be determined based on the end-of-charge voltage and the charging power of the charging apparatus during the present charging; and then step 230 and step 240 are performed to determine the remaining charging time of the battery.

The method 222 specifically includes the following steps.

Step 2221: Obtain a second full-charge voltage.

The second full-charge voltage is an actual value of an end-of-charge voltage of the battery during the previous charging. Specifically, in the previous charging, the actual value of the end-of-charge voltage of the battery during the previous charging is recorded, and the end-of-charge voltage of the battery during the previous charging is stored in a storage module. During the present charging, the second full-charge voltage can be obtained from the memory. The storage module may be a non-volatile memory (NVM), and the actual value of the end-of-charge voltage of the battery during the previous charging may be stored as an NVM variable.

Step 2222: Obtain the charging power of the charging apparatus during the present charging.

Step 2223: Determine the second charging current during the present charging based on the second full-charge voltage and the charging power of the charging apparatus during the present charging.

The second charging current is a charging current of the battery when the battery is fully charged. Specifically, according to a formula: Charging current of the battery when the battery is fully charged=Charging power of the charging apparatus/Second full-charge voltage, the second charging current during the present charging can be determined.

The end-of-charge voltage of the battery is related to a state of health (SOH) of the battery and a voltage value of a battery cell. Therefore, with an increase in times of charging, the SOH gradually decreases, and the voltage value of the battery cell changes, causing a larger error between a calculated value and the actual value of the end-of-charge voltage of the battery. According to the method 222, the actual value of the end-of-charge voltage of the battery during the previous charging is recorded and invoked, and the charging current of the battery when the battery is fully charged is determined based on the end-of-charge voltage and the charging power of the charging apparatus; and then step 230 and step 240 are performed to determine the remaining charging time of the battery. A calculation error due to the end-of-charge voltage of the battery is reduced by using the actual value of the end-of-charge voltage of the battery during the previous charging, and the charging current when the battery is fully charged this time is calculated with higher accuracy, making the calculation result of the remaining charging time of the battery more reliable.

In addition, within a cycle of using the battery, the method 200 may be performed by performing the method 221 or the method 222 alone. Alternatively, depending on changes in a status of the battery, the method 221 or the method 222 may be selected based on a level of battery aging.

Figure 5:
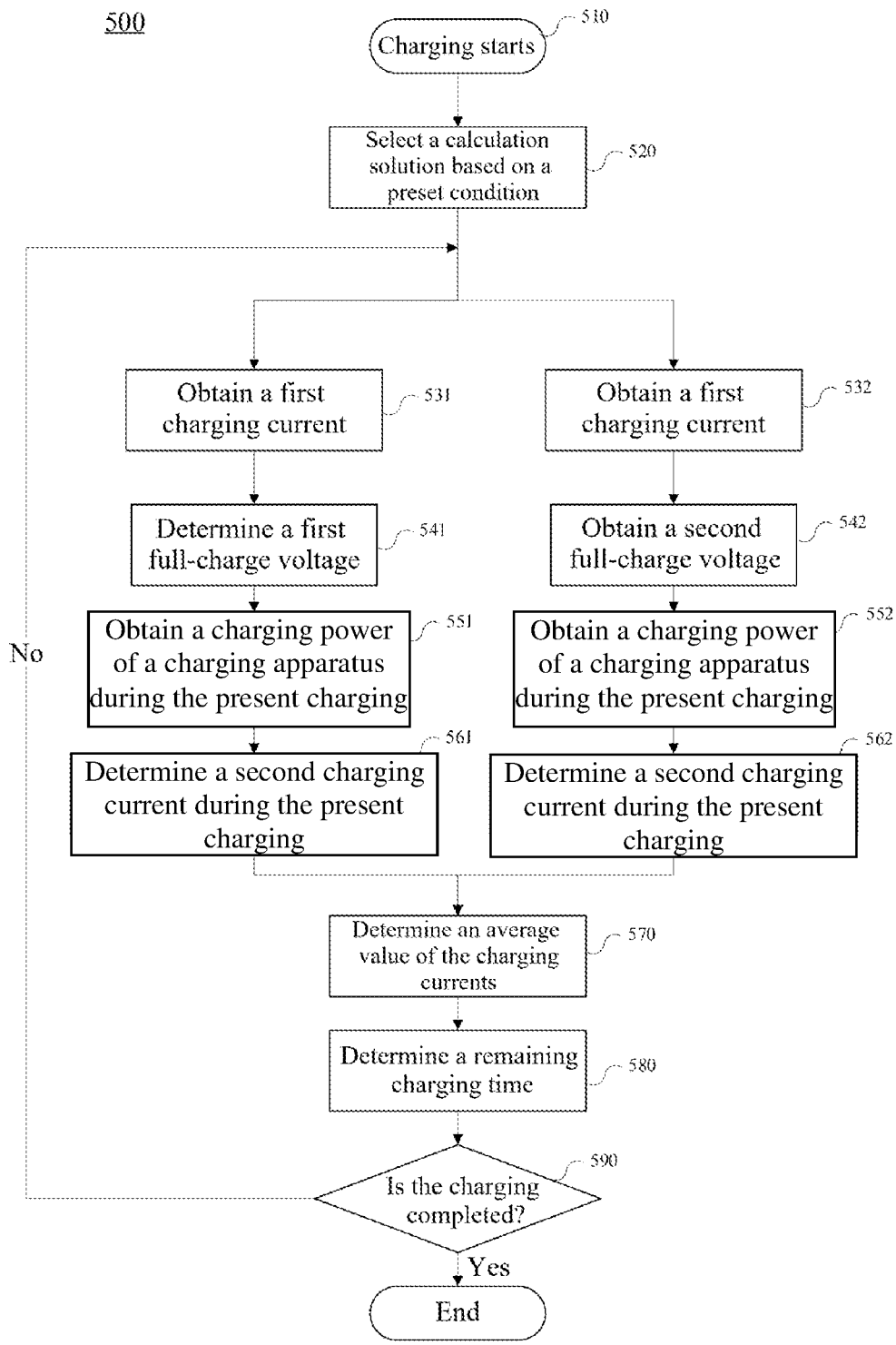
FIG. 5 is a schematic flowchart of another method for determining a remaining charging time of a battery disclosed in an embodiment of the present application.

FIG. 5 is a schematic flowchart of a possible implementation based on the foregoing method. A remaining charging time of a battery is calculated based on an average value of charging currents, which reduces errors due to changes of a current in calculation of the remaining charging time of the battery, improving accuracy of calculation of the remaining charging time of the battery. The method 500 may specifically include the following steps.

Step 510: Charging starts.

Step 520: Select a calculation solution based on a preset condition.

The calculation solution may be selected based on the preset condition, such as times of charging, a level of battery aging, or another preset determination condition. An appropriate calculation method is selected based on a specific condition of a battery, so that a calculation result can be more accurate.

For example, when the number of times of charging for the present charging is less than a preset threshold or the level of aging of the charged battery is relatively low, the method 221 is selected, to proceed to step 531; and when the number of times of charging for the present charging is greater than or equal to the preset threshold or the level of aging of the charged battery is relatively high, the method 222 is selected, to proceed to step 532.

Step 531: Obtain a first charging current. The first charging current is a present charging current of the battery.

Step 541: Determine a first full-charge voltage. The first full-charge voltage is a calculated value of an end-of-charge voltage of the battery.

Step 551: Obtain a charging power of a charging apparatus during the present charging.

Step 561: Determine a second charging current during the present charging. The second charging current is a charging current of the battery when the battery is fully charged.

A specific implementation of the foregoing steps is the same as that in the foregoing embodiment. Details are not described herein again.

Step 532: Obtain a first charging current. The first charging current is a present charging current of the battery.

Step 542: Obtain a second full-charge voltage. The second full-charge voltage is an actual value of an end-of-charge voltage of the battery during the previous charging.

Step 552: Obtain a charging power of a charging apparatus during the present charging.

Step 562: Determine a second charging current during the present charging. The second charging current is a charging current of the battery when the battery is fully charged.

A specific implementation of the foregoing steps is the same as that in the foregoing embodiment. Details are not described herein again.

Step 570: Determine an average value of the charging currents.

Specifically, the average value of the charging currents is obtained by adding up and averaging the first charging current and the second charging current.

Step 580: Determine a remaining charging time.

Specifically, according to a formula for calculating the remaining charging time: Remaining charging time of the battery=Remaining capacity of the battery/Average value of the charging currents, the corresponding current remaining charging time of the battery can be obtained.

Step 590: Determine whether the charging is completed.

If the present charging is not completed, the remaining charging time is further determined according to the solution selected in step 520. If the charging is completed, the calculation procedure ends.

It can be learned from the method in the foregoing possible implementation that, the remaining charging time of the battery is calculated based on the average value of the charging currents, which reduces errors due to changes of a value of a current output in real time in calculation of the remaining charging time of the battery; and an accurate remaining charging time of the battery can be obtained in an initial phase of charging, making a calculation result of the remaining charging time of the battery closer to an actual charging time.

A storage module is configured to store the second full-charge voltage.

A processing module is configured to: obtain a first charging current, where the first charging current is a present charging current of the battery; determine a second charging current, where the second charging current is a charging current of the battery when the battery is fully charged; determine an average value of the charging currents based on the first charging current and the second charging current; and determine the remaining charging time based on the average value of the charging currents.

The processing module is further configured to: determine the second charging current during the present charging based on a first full-charge voltage and a charging power of a charging apparatus during the present charging, where the first full-charge voltage is a calculated value of an end-of-charge voltage of the battery.

The processing module is further configured to: determine the second charging current during the present charging based on a second full-charge voltage and a charging power of a charging apparatus during the present charging, where the second full-charge voltage is an actual value of an end-of-charge voltage of the battery during the previous charging.

Specifically, the processing module may be configured to perform the method 200, the method 221, the method 222, and/or the method 500.

Figure 6:
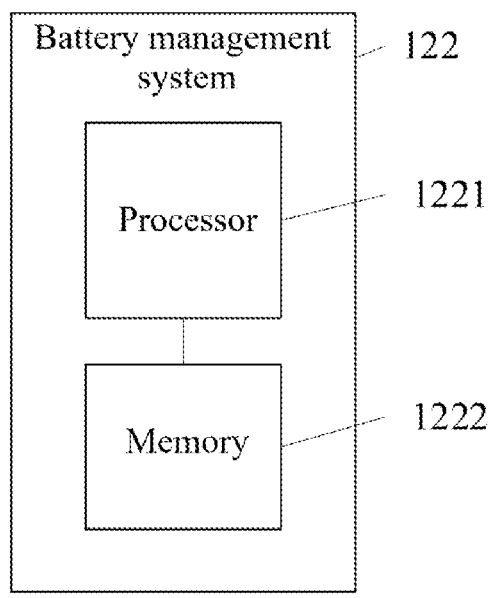
FIG. 6 is a schematic structural diagram of a battery management system disclosed in an embodiment of the present application.

As shown in FIG. 6, an embodiment of the present application further provides a battery management system 122, including a processor 1221 and a memory 1222. The memory 1222 is configured to invoke a computer program to perform the method for determining a remaining charging time of a battery according to the foregoing embodiments of the present application.

An embodiment of the present application further provides a readable storage medium configured to store a computer program, where the computer program is used to perform the method for determining a remaining charging time of a battery according to the foregoing embodiments of the present application.

Although the present application is described with reference to some embodiments, various improvements may be made thereto, and the components thereof may be replaced with equivalents, without departing from the scope of the present application. Especially, various technical features mentioned in the embodiments may be combined together in any manner as long as there is no structural conflict. The present application is not limited to specific embodiments disclosed herein, but includes all technical solutions that fall within the scope of the claims.

What is claimed is:

1. A method for determining a remaining charging time of a battery, comprising:
    obtaining a first charging current, wherein the first charging current is a present charging current of the battery;
    determining a second charging current, wherein the second charging current is a charging current of the battery when the battery is fully charged, and determining the second charging current comprises:
        determining the second charging current during a present charging based on a full-charge voltage and a charging power of a charging apparatus during the present charging, wherein the full-charge voltage is an actual value of an end-of-charge voltage of the battery during a previous charging;
    determining an average charging current value based on the first charging current and the second charging current; and
    determining the remaining charging time based on the average charging current value.

2. A system for determining a remaining charging time of a battery, comprising a processing module configured to:
    obtain a first charging current, wherein the first charging current is a present charging current of the battery;
    determine a second charging current, wherein the second charging current is a charging current of the battery when the battery is fully charged, and determining the second charging current comprises:
        determining the second charging current during a present charging based on a full-charge voltage and a charging power of a charging apparatus during the present charging, wherein the full-charge voltage is an actual value of an end-of-charge voltage of the battery during a previous charging;
    determine an average charging current value based on the first charging current and the second charging current; and
    determine the remaining charging time based on the average charging current value.

3. The system according to claim 2, further comprising a storage module configured to store the full-charge voltage.

4. A battery management system, comprising:
    a memory storing a computer program; and
    a processor configured to invoke the computer program to:
        obtain a first charging current, wherein the first charging current is a present charging current of the battery;
        determine a second charging current, wherein the second charging current is a charging current of the battery when the battery is fully charged, and determining the second charging current comprises:
            determining the second charging current during a present charging based on a full-charge voltage and a charging power of a charging apparatus during the present charging, wherein the full-charge voltage is an actual value of an end-of-charge voltage of the battery during a previous charging;
        determine an average charging current value based on the first charging current and the second charging current; and
        determine the remaining charging time based on the average charging current value.

* * * * *